(12) United States Patent
Yoon et al.

(10) Patent No.: US 8,995,480 B2
(45) Date of Patent: Mar. 31, 2015

(54) TUNABLE LASER MODULE

(71) Applicant: Electronics and Telecommunications Research Institute, Daejeon (KR)

(72) Inventors: Ki-Hong Yoon, Daejeon (KR); O-Kyun Kwon, Daejeon (KR); Su Hwan Oh, Daejeon (KR); Kisoo Kim, Daejeon (KR); Byung-seok Choi, Daejeon (KR); Hyun Soo Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 113 days.

(21) Appl. No.: 13/676,760

(22) Filed: Nov. 14, 2012

(65) Prior Publication Data

US 2013/0243013 A1     Sep. 19, 2013

(30) Foreign Application Priority Data

Mar. 14, 2012 (KR) .......................... 10-2012-0026122

(51) Int. Cl.
*H01S 3/10* (2006.01)
*H01S 5/14* (2006.01)
(Continued)

(52) U.S. Cl.
CPC . *H01S 3/10* (2013.01); *H01S 5/142* (2013.01); *H01S 3/1055* (2013.01); *H01S 5/0612* (2013.01); *H01S 5/4006* (2013.01)
USPC .................. 372/20; 372/23; 372/26; 372/96; 372/99

(58) Field of Classification Search
CPC ..... H01S 3/1055; H01S 5/0265; H01S 5/142; H01S 3/0675; H01S 3/10053; H01S 5/06256; H01S 3/10; H01S 5/0612; H01S 3/08009; H01S 3/10007

USPC .............. 372/20, 23, 26, 50.1, 50.11, 94, 102
See application file for complete search history.

(56) References Cited

U.S. PATENT DOCUMENTS 5,770,466 A * 6/1998 Sasaki et al. ..................... 438/31
7,310,363 B1 * 12/2007 Mason et al. ................ 372/50.1
(Continued)

FOREIGN PATENT DOCUMENTS

EP     1 056 228 A3     11/2000

OTHER PUBLICATIONS

Jonathon S. Barton et al., "A Widely Tunable High-Speed Transmitter Using an Integrated SGDBR Laser-Semiconductor Optical Amplifier and Mach-Zehnder Modulator", IEEE Journal of Selected Topics in Quantum Electronics, Sep./Oct. 2003, pp. 1113-1117, vol. 9. No. 5.

(Continued)

*Primary Examiner* — Colleen A Matthews
*Assistant Examiner* — Delma R Forde
(74) *Attorney, Agent, or Firm* — Rabin & Berdo, P.C.

(57) ABSTRACT

The present disclosure relates to a tunable laser module including a light gain area unit for outputting an optical signal; an optical distributor for separating the optical signal output from the light gain area unit; two comb reflection units for reflecting a part of optical signals separated by the optical distributor and allow a part of the optical signals to penetrate; two phase units for changing phases of the optical signals penetrating the two comb reflection units; an optical coupler for combining the optical signals of which the phases are changed by the two phase units; and an optical amplifier for amplifying the optical signal combined by the optical coupler, wherein the light gain area unit oscillates a laser by totally reflecting the optical signals reflected by the two comb reflection units.

14 Claims, 3 Drawing Sheets

(51) Int. Cl.
*H01S 3/1055* (2006.01)
*H01S 5/06* (2006.01)
*H01S 5/40* (2006.01)

(56) References Cited

U.S. PATENT DOCUMENTS

| | | | |
|---|---|---|---|
| 7,957,618 B2 | 6/2011 | Rigole et al. | |
| 2008/0094123 A1* | 4/2008 | Koh et al. | 327/513 |
| 2008/0107429 A1* | 5/2008 | Galli et al. | 398/188 |
| 2010/0142567 A1* | 6/2010 | Ward et al. | 372/20 |
| 2011/0157670 A1 | 6/2011 | Koch | |
| 2011/0267676 A1* | 11/2011 | Dallesasse et al. | 359/279 |
| 2012/0057079 A1* | 3/2012 | Dallesasse et al. | 348/724 |
| 2012/0057609 A1* | 3/2012 | Dallesasse et al. | 372/20 |
| 2012/0057610 A1* | 3/2012 | Dallesasse et al. | 372/20 |

OTHER PUBLICATIONS

D. M. Adams et al., "Transmission performance of monolithically integrated Y-branch tunable laser with zero-chirp Mach-Zehnder modulator", Electronics Letters, Apr. 26, 2007, vol. 43, No. 9.

* cited by examiner

TUNABLE LASER MODULE

CROSS-REFERENCE TO RELATED APPLICATIONS

This application is based on and claims priority from Korean Patent Application No. 10-2012-0026122, filed on Mar. 14, 2012, with the Korean Intellectual Property Office, the disclosure of which is incorporated herein in its entirety by reference.

TECHNICAL FIELD

The present disclosure relates to a laser module, and more particularly, to a monolithic integrated tunable laser module for high-speed modulation, high-power output, and long-term optical transmission.

BACKGROUND

As a wavelength division multiplexing-passive optical network (WDM-PON) capable of providing a high capacity communication service through wavelength allocation becomes important, a development of light sources to be used in the WDM-PON has been significant. The WDM-PON needs a high-speed modulation tunable laser module capable of finely changing wavelengths of respective channels while changing the wavelengths of the channels having a predetermined wavelength interval, and performing high-speed modulation.

A representative high-speed tunable laser module among the high-speed tunable laser modules proposed up to now is a tunable laser module using a sampled grating distributed Bragg reflector (SG-DBR) disclosed in U.S. Pat. No. 4,896,325, and has a laser structure for modulating an optical signal output from the sampled grating distributed Bragg reflector by forming resonance of laser by integrating a gain range and a phase control range between two sampled grating distributed Bragg reflectors and then integrating an optical modulator at a distal end of one sampled grating distributed Bragg reflector between the two sampled grating distributed Bragg reflectors. The sampled grating distributed Bragg reflector has a narrow tunable range of 10 nm or less, and the Vernier effect by the two sampled grating distributed Bragg reflectors is used in order to obtain a wide tunable range.

Further, in order to substitute the tunable laser module using the Bragg grating reflector, a monolithic integrated tunable laser module using two ring resonators having slightly different free spectral ranges (FSR) was published (Thesis: PHOTONICS TECHNOLOGY LETTERS, Vol. 14, No. 5, p 600, 2002, IEEE PHOTONICS TECHNOLOGY LETTERS, Vol. 21, No. 13, p 851, 2009, and IEEE Journal of Lightwave Technology, Vol. 24, No. 4, p 1865, 2006). In the thesis, an output wavelength of the laser is varied by an interval of the free spectral ranges by fixing a refractive index of one ring resonator and varying a refractive index of the other ring resonator.

Further, a Y-branch tunable laser module in which a laser output terminal is positioned in a gain range, which is different from the tunable laser module using the sampled grating distributed Bragg reflector, was introduced (Thesis: Proceedings Symposium IEEE/LEOS Benelux, p 55, 2003). The Y-branch tunable laser module has a structure in which an optical signal output from one output terminal in the gain range is distributed to two tunable reflectors having different free spectral ranges by using an optical distributor, and outputs a ranged signal to the remaining one output terminal in the gain range. The Y-branch tunable laser module may obtain a wide tunable range by using the Vernier effect identically to the tunable laser module using the sampled grating distributed Bragg reflector. Further, the Y-branch tunable laser module may have a structure in which an additional reflector is integrated in the output terminal of the gain range and then an optical modulator and an optical amplifier are integrated for the high-speed modulation (Thesis: IEE Electronics Letters, vol. 43, no. 9, 2007).

FIG. 1 is a diagram illustrating a structure of a conventional Y-branch tunable laser module.

Referring to FIG. 1, an optical signal output from an one-side cross section of a light gain area unit 101 is separated into two optical signals by an optical distributor 102, the two optical signals are reflected to the light gain area unit 101 by sampled grating distributed Bragg reflectors (SG-DBRs) 104 and 105 having different free spectral ranges again, and the reflected optical signals are reflected in an opposite-side cross-section 106 of the light gain area unit 101 to oscillate a laser. Here, the two reflectors 104 and 105 reflect multi-wavelength optical signals, and the single-wavelength laser is output in one matched wavelength among the reflective wavelengths of the two reflectors 104 and 105 (Vernier effect). Further, since reflection and output need to be generated in the opposite-side cross section 106 of the light gain area unit 101, reflectivity is required to be adjusted by coating the opposite-side cross section 106 of the light gain area unit 101 so that the optical signal is not totally reflected, but partially reflected. That is, an output characteristic is determined according to a degree of the coating of the opposite-side cross section 106 of the light gain area unit 101. Further, one reflector between the two reflectors 104 and 105 includes a phase unit 103, so that phases of the optical signals reflected from the two reflectors 104 and 105 are controlled.

FIG. 2 is a diagram illustrating a structure of a tunable laser module in which a Mach-Zehnder optical modulators is integrated in a conventional Y-branch tunable laser module in order to use the tunable laser module for high-speed modulation and long-term transmission.

Referring to FIG. 2, the light gain area unit 101 does not have a cross-section used for reflection and output, so that a reflection unit 206 is additionally integrated for the laser resonance. Further, in order to manufacture a Mach-Zehnder optical modulator, an optical distributor 204 for separating an optical signal into two optical signals and an optical coupler 201 for combining the two optical signals are used. In addition, the tunable laser module includes phase units 202 and 203 so that the two optical signals have different phases of 180°. Here, the characteristic of the optical modulator is determined by an accurate distribution ratio of the optical distributor 204 used for constituting the Mach-Zehnder optical modulator. Further, an optical amplifier 205 is used in order to amplify the optical signal output from the reflection unit 206.

FIG. 3 is a diagram illustrating a structure of a tunable laser module using a conventional sampled grating distributed Bragg reflector.

Referring to FIG. 3, an optical gain unit 303 and two multi-wavelength reflection units 302 and 304 having different free spectral ranges are used, so as to vary a wide wavelength range by the Vernier effect. An optical amplifier 301 is used in order to amplify a single wavelength laser optical signal output from one of the two multi-wavelength reflection units 302 and 304, and the optical coupler 201 and the optical distributor 204 are used in order to constitute the Mach-Zehnder optical modulator. Further, the tunable laser module includes the phase units 202 and 203 so that the two optical signals separated by the optical distributor 204 have different phases of 180°.

However, the Mach-Zehnder optical modulator formed of the optical coupler, the optical distributor and two arms needs to be separately manufactured in the conventional tunable laser module, so that a structure of the tunable laser module is complex and it is difficult to achieve the monolithic integration.

SUMMARY

The present disclosure has been made in an effort to provide a tunable laser module capable of achieving high-speed modulation, high-power output, and long-term communication.

Further, the present disclosure provides a tunable laser module capable of efficiently monolithically integrating a Mach-Zehnder optical modulator.

An exemplary embodiment of the present disclosure provides a tunable laser module, comprising: a light gain area unit configured to output an optical signal; an optical distributor configured to separate the optical signal output from the light gain area unit; two comb reflection units configured to reflect a part of optical signals separated by the optical distributor and allow a part of the optical signals to penetrate; two phase units configured to change phases of the optical signals penetrating the two comb reflection units; an optical coupler configured to combine the optical signals of which the phases are changed by the two phase units; and an optical amplifier configured to amplify the optical signal combined by the optical coupler, wherein the light gain area unit oscillates a laser by totally reflecting the optical signals reflected by the two comb reflection units.

Another exemplary embodiment of the present disclosure provides a tunable laser module, comprising: a light gain area unit configured to output an optical signal; two comb reflection units configured to oscillate a laser by reflecting the optical signal output from the light gain area unit; two phase units configured to change phases of optical signals output from the two comb reflection units; an optical coupler configured to combine the optical signals of which the phases are changed by the two phase units; and an optical amplifier configured to amplify the optical signal combined by the optical coupler.

Accordingly, the aforementioned present disclosure provides the tunable laser module using the two output terminals as the two arms of the Mach-Zehnder optical modulator, so that the tunable laser module according to the present disclosure has a simple structure and excellent output characteristics compared to the existing monolithic integrated tunable laser module.

Further, the tunable laser module according to the present disclosure is capable of performing high-speed modulation and has the excellent output characteristic, thereby being capable of performing the long-term transmission.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Hereinafter, exemplary embodiments of the present disclosure will be described in detail with reference to the accompanying drawings. In describing the present disclosure, a detailed description of related known configurations and functions will be omitted when it may make the essence of the present disclosure obscure.

Figure 4:
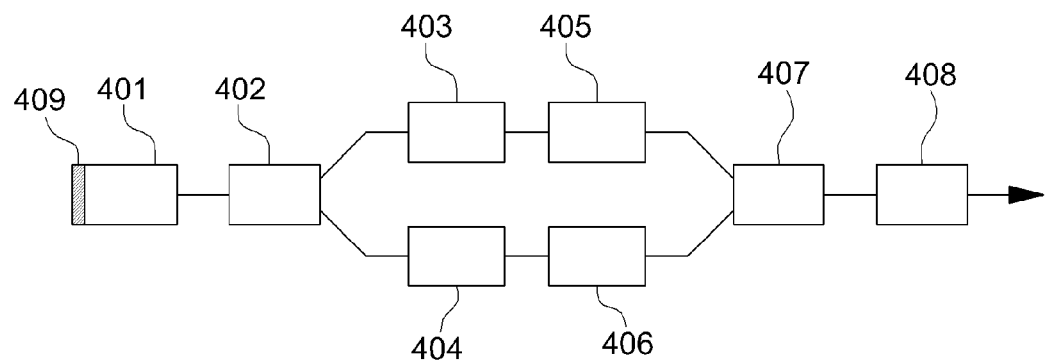
FIG. 4 is a diagram illustrating a configuration of a tunable laser module according to an exemplary embodiment of the present disclosure.

FIG. 4 is a diagram illustrating a configuration of a tunable laser module according to an exemplary embodiment of the present disclosure.

Referring to FIG. 4, the tunable laser module according to an exemplary embodiment of the present disclosure includes a light gain area unit 401, an optical distributor 402, two comb reflection units 403 and 404, two phase units 405 and 406, an optical coupler 407 and an optical amplifier 408. Here, the light gain area unit 401, the optical distributor 402, the two comb reflection units 403 and 404, the two phase units 405 and 406, the optical coupler 407 and the optical amplifier 408 are integrated in one substrate (not shown).

The light gain area unit 401 outputs an optical signal. Further, the light gain area unit 401 oscillates a laser by totally reflecting an optical signal reflected from the two comb reflection units 403 and 404 by using a total reflection coating film 409 formed in one surface thereof.

The optical distributor 402 separates the optical signal output from the light gain area unit 401.

The two comb reflection units 403 and 404 have the same reflectivity and different free spectral ranges. Accordingly, when the reflectivity of the two comb reflection units 403 and 404 is 100% or lower, the optical signal oscillated from the laser is output through the two comb reflection units 403 and 404. Further, since the two comb reflection units 403 and 404 have the same reflectivity, output characteristics of the optical signals output from the two comb reflection units 403 and 404 are the same. Accordingly, the two optical signals having the same light strength, the same phase and the same polarized light are input in the two phase units 405 and 406 for constituting the Mach-Zehnder optical modulator.

Further, each of the two comb reflection units 403 and 404 may include a grating distributed Bragg reflector or a ring resonator.

The two phase units 405 and 406 change the phases of the optical signals penetrating the two comb reflection units 403 and 404, so that an output characteristic of the optical coupler 407 is determined when the optical signals penetrating the two comb reflection units 403 and 404 are combined by the optical coupler 407. Specifically, when the two optical signals having the same light strength, the same phase and the same polarized light are combined by the optical coupler 407, the optical signal is input from the optical coupler 407 by constructive interference, and when a phase difference between the two optical signals is made to be 180° by using at least one phase unit between the two phase units 405 and 406, the optical signal is not output in the optical coupler 407 by destructive interference. That is, the two phase units 405 and 406 serve as the Mach-Zehnder optical modulator.

The optical coupler 407 combines the optical signals of which the phases are changed by the two phase units 405 and 406. Here, the optical coupler 407 may be a splitter, a gap coupler or a multimode interference coupler in which a waveguide is separated into two waveguides.

The optical amplifier 408 amplifies the optical signal combined by the optical coupler 407 in order to increase an output signal of the laser. Here, a spot size converter may be integrated in the output terminal of the optical amplifier 408 in order to maximize the output signal of the laser by increasing a ratio of the combination with the outside.

In addition, the tunable laser module according to the present disclosure may include a temperature controller (not shown) in a substrate (not shown) in order to stabilize the operation characteristic of the tunable laser module.

Figure 3:
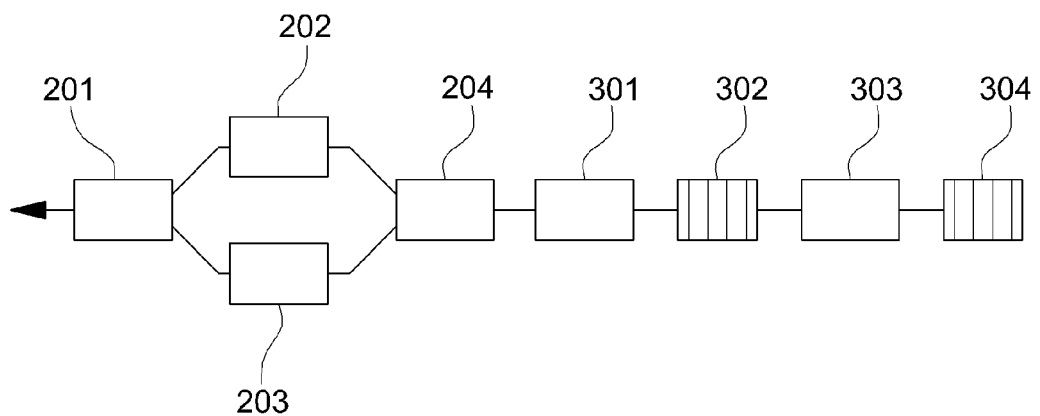
FIG. 3 is a diagram illustrating a structure of a tunable laser module using a conventional sampled grating distributed Bragg reflector.

Accordingly, while the tunable laser module of FIG. 3 light-modulates the optical signal output from one reflection unit between the two reflection units 302 and 304 through the Mach-Zehnder optical modulator 201, 202, 203 and 204 and does not use the optical signal output from the remaining reflection unit, the tunable laser module according to the present disclosure uses all of the optical signals output from the two comb reflection units 403 and 404.

Figure 1:
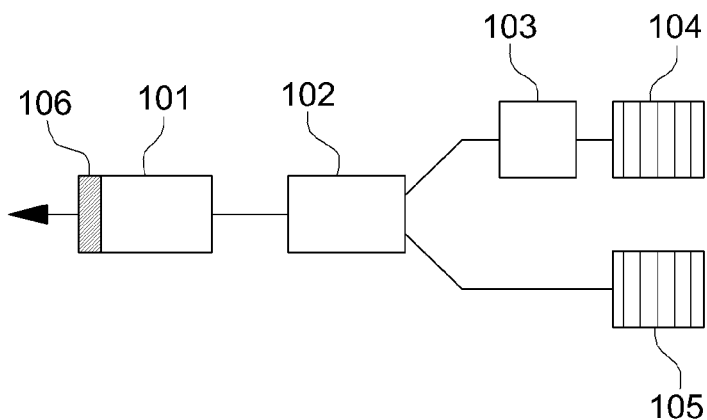
FIG. 1 is a diagram illustrating a structure of a conventional Y-branch tunable laser module.
Figure 2:
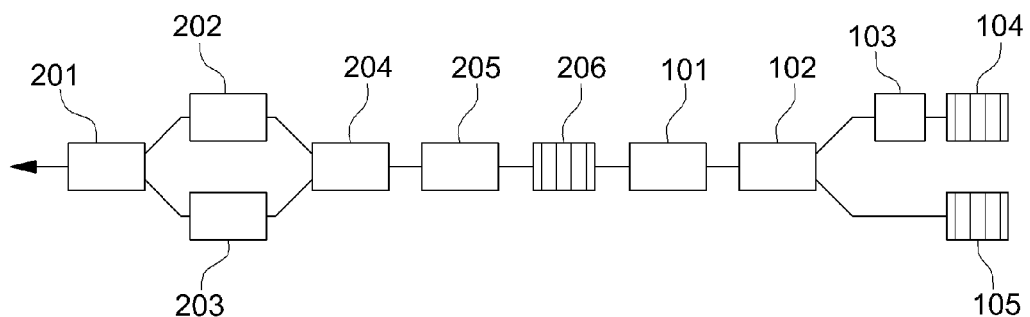
FIG. 2 is a diagram illustrating a structure of a tunable laser module in which Mach-Zehnder optical modulator is integrated in a conventional Y-branch tunable laser module order to use the tunable laser module for high-speed modulation and long-term transmission.

Further, while the Y-branch tunable laser module of FIG. 2 needs to use the additional reflection unit 206 in order to integrate the Mach-Zehnder optical modulator and also requires the optical distributor 102 for the Y-branch and the additional optical distributor 204 for constituting the Mach-Zehnder optical modulator, the tunable laser module according to the present disclosure uses the output terminals of the comb reflection units 403 and 404 as the arms of the Mach-Zehnder optical modulator, thereby achieving the very simple structure.

Figure 5:
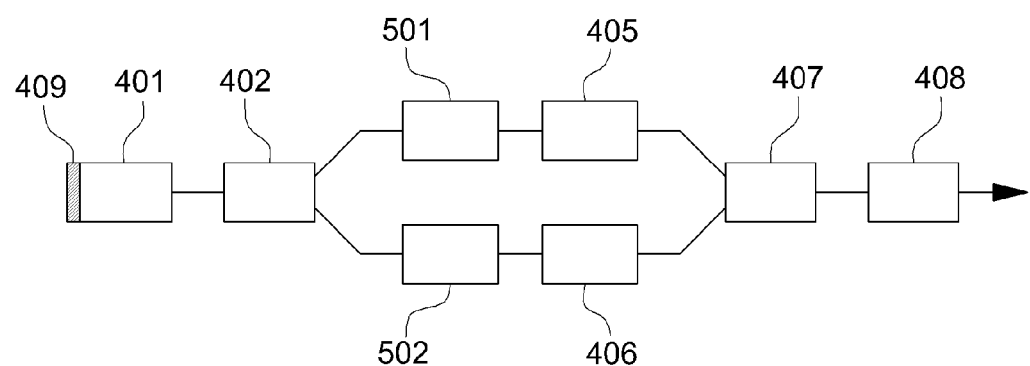
FIG. 5 is a diagram illustrating an example of an implementation of a tunable laser module according to an exemplary embodiment of the present disclosure.

FIG. 5 is a diagram illustrating an example of an implementation of a tunable laser module according to an exemplary embodiment of the present disclosure.

Referring to FIG. 5, two sampled grating distributed Bragg reflectors 501 and 502 having different free spectral ranges are used as the two comb reflection units 403 and 404 of the tunable laser module according to the exemplary embodiment of the present disclosure. Here, when one wavelength component of multi wavelength components output from the two sampled grating distributed Bragg reflectors 501 and 502 is reflected in the sampled grating distributed Bragg reflectors 501 and 502, the one wavelength component is oscillated in the laser.

Figure 6:
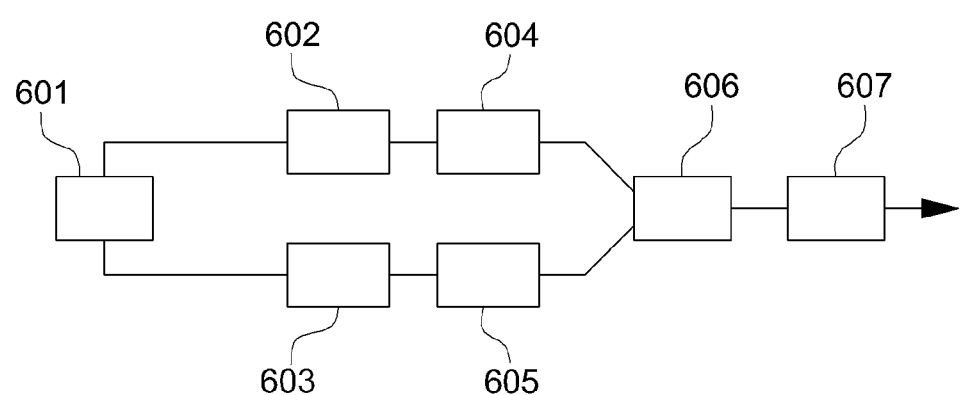
FIG. 6 is a diagram illustrating a configuration of a tunable laser module according to another exemplary embodiment of the present disclosure.

FIG. 6 is a diagram illustrating a configuration of a tunable laser module according to another exemplary embodiment of the present disclosure.

Referring to FIG. 6, the tunable laser module according to another exemplary embodiment of the present disclosure includes a light gain area unit 601, two comb reflection units 602 and 603, two phase units 604 and 605, an optical coupler 606 and an optical amplifier 607. Here, the light gain area unit 601, the two comb reflection units 602 and 603, the two phase units 604 and 605, the optical coupler 606 and the optical amplifier 607 are integrated in one substrate (not shown).

The light gain area unit 601 outputs an optical signal.

The two comb reflection units 602 and 603 have the same reflectivity and different free spectral ranges. Here, the two comb reflection units 602 and 603 oscillate a laser by reflecting the optical signal output from the light gain area unit 601 and outputs the optical signal oscillated from the laser. In this case, since the two comb reflection units 602 and 603 have the same reflectivity, output characteristics of the optical signals output from the two comb reflection units 602 and 603 are the same. Accordingly, the two optical signals having the same light strength, the same phase and the same polarized light are input in the two phase units 604 and 605 for constituting the Mach-Zehnder optical modulator.

Further, each of the two comb reflection units 602 and 603 may include a grating distributed Bragg reflector or a ring resonator.

The two phase units 604 and 605 change the phases of the optical signals penetrating the two comb reflection units 602 and 603, so that an output characteristic of the optical coupler 606 is determined when the optical signals penetrating the two comb reflection units 602 and 603 are combined by the optical coupler 606. Specifically, when the two optical signals having the same light strength, the same phase and the same polarized light are combined by the optical coupler 606, the optical signal is output from the optical coupler 606 by constructive interference, and when a phase difference between the two optical signals is made to be 180° by using at least one phase unit between the two phase units 604 and 605, the optical signal is not output in the optical coupler 606 by destructive interference. That is, the two phase units 604 and 605 serve as the Mach-Zehnder optical modulator.

The optical coupler 606 combines the optical signals of which the phases are changed by the two phase units 604 and 605. Here, the optical coupler 606 may be a splitter, a gap coupler or a multimode interference coupler in which a waveguide is separated into two waveguides.

The optical amplifier 607 amplifies the optical signal combined by the optical coupler 606 in order to increase an output signal of the laser. Here, a spot size converter may be integrated in the output terminal of the optical amplifier 607 in order to maximize the output signal of the laser by increasing a ratio of the combination with the outside.

In addition, the tunable laser module according to the present disclosure may include a temperature controller (not shown) in a substrate (not shown) in order to stabilize the operation characteristic of the tunable laser module.

Figure 7:
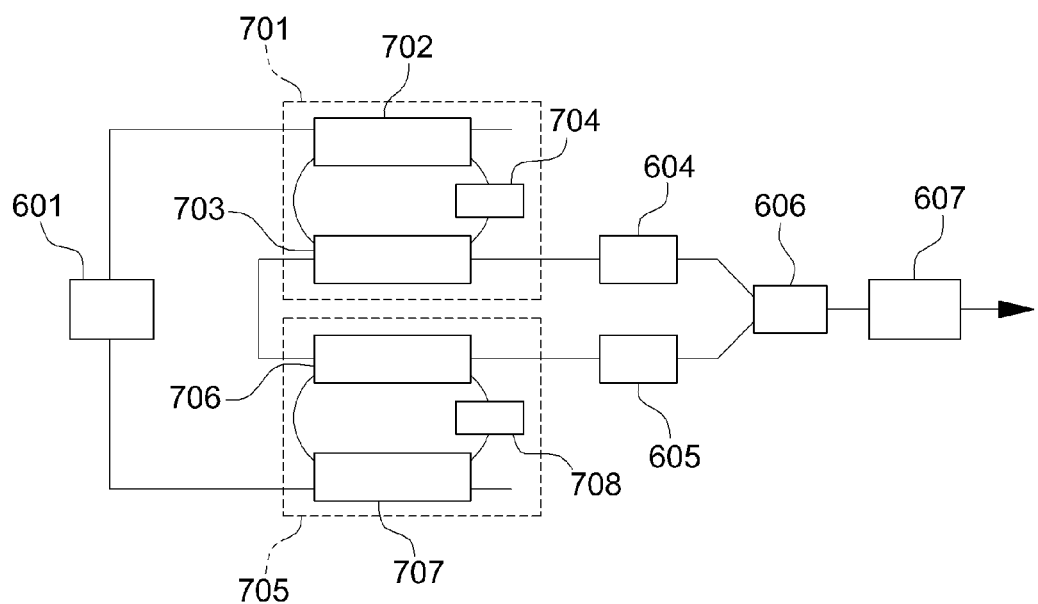
FIG. 7 is a diagram illustrating an example of an implementation of a tunable laser module according to another exemplary embodiment of the present disclosure.

FIG. 7 is a diagram illustrating an example of an implementation of a tunable laser module according to another exemplary embodiment of the present disclosure.

Referring to FIG. 7, two ring resonators 701 and 705 having different free spectral ranges are used as the two comb reflection units 602 and 603 of the tunable laser module according to another exemplary embodiment of the present disclosure.

One ring resonator 701 includes two optical distributors 702 and 703 provided with two input terminals and one output terminal or two input terminals and two output terminals and a phase unit 704 for changing a phase within a curve waveguide and the ring resonator. The other ring resonator 705 includes two optical distributors 706 and 707, a curve waveguide and a phase unit 708. Accordingly, the optical signal output from the light gain area unit 601 is reflected by the two ring resonators 701 and 705, the laser is resonated in a wavelength matching to the reflective wavelengths of the two ring resonators 701 and 705, and the phase of the optical signal is varied by using the phase units 704 and 708 included in the two ring resonators 701 and 705, so that an output wavelength of the laser may be changed by changing the wavelength matching with the reflective wavelength.

Further, one output terminal between the two output terminals of the optical distributors 702 and 707 constituting the ring resonators 701 and 705 may be connected to the phase units 604 and 605 constituting the Mach-Zehnder optical modulator, and the other output terminal may be connected to a sensor for monitoring the output of the laser or an optical absorber in order to prevent the output characteristic of the laser from being deteriorated by internal reflection.

The exemplary embodiments disclosed in the present disclosure are intended to illustrate the scope of the technical idea of the present disclosure, and the scope of the present disclosure is not limited by the embodiment. The scope of the present disclosure shall be construed on the basis of the accompanying claims so that all of the technical ideas included within the scope equivalent to the claims belong to the present disclosure.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A tunable laser module, comprising:
   a light gain area unit configured to output an optical signal;
   an optical distributor configured to separate the optical signal output from the light gain area unit;
   two comb reflection units configured to reflect a part of optical signals separated by the optical distributor and allow a part of the optical signals to penetrate;
   two phase units configured to change phases of the optical signals penetrating the two comb reflection units;
   an optical coupler configured to combine the optical signals of which the phases are changed by the two phase units; and
   an optical amplifier configured to amplify the optical signal combined by the optical coupler,
   wherein the light gain area unit oscillates a laser by totally reflecting the optical signals reflected by the two comb reflection units, and
   wherein output terminals of the two comb reflection units are used as arms of a Mach-Zehnder optical modulator, and the two phase units serve as the Mach-Zehnder optical modulator by adjusting the phases of the optical signals penetrating the two comb reflection units.

2. The tunable laser module of claim 1, wherein each of the two comb reflection units comprises a grating distributed Bragg reflector or a ring resonator.

3. The tunable laser module of claim 1, wherein the two comb reflection units have an identical reflectivity and different free spectral ranges.

4. The tunable laser module of claim 1, further comprising a spot size converter configured to maximize an external output signal by changing a size of a mode in an output terminal of the optical amplifier.

5. The tunable laser module of claim 1, further comprising a temperature controller configured to control a temperature in order to stabilize an operation characteristic of the tunable laser module.

6. The tunable laser module of claim 1, wherein the optical coupler is one of a splitter, a gap coupler, and a multimode interference coupler in which a waveguide is separated into two waveguides.

7. A tunable laser module, comprising:
   a light gain area unit configured to output an optical signal;
   two comb reflection units configured to oscillate a laser by reflecting the optical signal output from the light gain area unit;
   two phase units configured to change phases of optical signals output from the two comb reflection units;
   an optical coupler configured to combine the optical signals of which the phases are changed by the two phase units; and
   an optical amplifier configured to amplify the optical signal combined by the optical coupler,
   wherein output terminals of the two comb reflection units are used as arms of a Mach-Zehnder optical modulator, and the two phase units serve as the Mach-Zehnder optical modulator by adjusting the phases of the optical signals penetrating the two comb reflection units.

8. The tunable laser module of claim 7, wherein the two comb reflection units have an identical reflectivity and different free spectral ranges.

9. The tunable laser module of claim 7, further comprising a spot size converter configured to maximize an external output signal by changing a size of a mode in an output terminal of the optical amplifier.

10. The tunable laser module of claim 7, further comprising a temperature controller configured to control a temperature in order to stabilize an operation characteristic of the tunable laser module.

11. The tunable laser module of claim 7, wherein each of the two comb reflection units comprises a grating distributed Bragg reflector or a ring resonator.

12. The tunable laser module of claim 11, wherein the ring resonator comprises two optical distributors, a curve waveguide and a phase unit.

13. The tunable laser module of claim 11, wherein one output terminal of two output terminals of the ring resonator is connected to a sensor for monitoring an output of the laser or an optical absorber in order to remove internal reflection.

14. The tunable laser module of claim 7, wherein the optical coupler includes one of a splitter, a gap coupler, and a multimode interference coupler in which a waveguide is separated into two waveguides.

* * * * *